United States Patent [19]

Stenger-Smith et al.

[11] Patent Number: 5,247,055

[45] Date of Patent: Sep. 21, 1993

[54] ACCORDION-LIKE POLYMERS FOR NONLINEAR APPLICATIONS

[76] Inventors: John D. Stenger-Smith, 1133 Meadowview La.; Ronald Henry, 329 Perdew Ave.; James Hoover, 408 W. Vanessa Ave.; Geoffrey Lindsay, 941 A Atkins, all of Ridgecrest; John Fischer, 304 Owens Peak Rd., Inyokern, all of Calif. 93555; Kenneth J. Wynne, 6342 Villa La., Falls Church, Va. 22044-1618

[21] Appl. No.: 856,437

[22] Filed: Mar. 20, 1992

[51] Int. Cl.$^5$ .................... C08G 69/08; C08G 73/10
[52] U.S. Cl. .................... 528/310; 528/314; 528/321; 528/331; 528/335; 528/337; 430/286
[58] Field of Search ............. 528/310, 314, 321, 331, 528/335, 337; 430/286

[56] References Cited

U.S. PATENT DOCUMENTS 4,900,127  2/1990  Robello et al. .................... 528/373
5,102,973  4/1992  Iimura et al. .................... 528/291

Primary Examiner—John Kight, III
Assistant Examiner—John M. Cooney, Jr.
Attorney, Agent, or Firm—Stuart H. Nissim; Melvin J. Sliwka; John L. Forrest, Jr.

[57] ABSTRACT

The present invention discloses new polymers which can assume an accordion-like conformation of the backbone. These polymers are prepared by the copolymerization of two difuntional, chemically precoupled precursors to chromophoric units. The resulting polymers have a head-to-head, tail-to-tail topology (a syndioregic arrangement of rigid units along the polymer backbone), and the molecular units are designed to fold into an "accordion" conformation. This useful microstructure (a three-dimensional conformation) forms spontaneously (self-assembles); or, it can be brought about by field-assisted processing. Films and fibers of these polymers have useful second-order nonlinear optical properties, and may be used for the modulation and switching of optical communications signals.

9 Claims, No Drawings

ACCORDION-LIKE POLYMERS FOR NONLINEAR APPLICATIONS

BACKGROUND OF THE INVENTION

1. Related Art

There are many known polymers which are comprised of an alternating sequence of rigid aromatic monomer units and other connecting units. These include many of the so-called engineering thermoplastics. Typical of these are the aromatic polycarbonates, polyarylethers, polyarylsulfones, and aromatic-aliphatic polyesters, such as poly(butylene teraphthalate) These polymers are either amorphous solids comprised of randomly coiled chains, or partially crystalline solids comprised of microcrystalline bundles of chains in which the local conformation (i.e., the conformation of a run of two or more repeat units along the chain) is in an extended conformation. Some of these engineering polymers can be oriented to give highly birefringent materials, but will not exhibit the large second-order nonlinear optical properties of the polymers of the present invention.

The polymer science literature also contains many descriptions of mainchain liquid crystal polymers in which the repeat units in the backbone are comprised of rigid mesogens or chromophores. Mesogens of neighboring chains tend to align parallel to one another in the solid state forming nematic or smectic phases. Some of these known mainchain liquid crystalline polymers also contain "flexible spacer units". The long axis of the rigid mesogenic repeat units of known polymers is aligned essentially parallel with the local axis of the polymer chain. This extended local conformation is illustrated by the formula:

[1]

where the rigid mesogenic units (rectangles) are connected by flexible spacer units (connecting lines)

Aligning ground-state dipole moments in polarizable polymers imparts useful properties, such as second-order optical nonlinearity, and piezoelectric and pyroelectric properties.

There have been reports in the literature of sidechain and mainchain chromophoric polymers which can be poled in an electric field, or deposited by Langmuir-Blodgett techniques, to give films having second-order nonlinear optical properties. The mainchain chromophoric polymers reported to date, have the chromophoric dipole moments pointing in the same direction along the chain, in a head-to-tail arrangement. This configuration is not entirely satisfactory because of the difficulty in ordering all of the chains to lie in the same direction, which is a requirement for second-order nonlinear optical properties.

Electric field poling.

A useful process for the fabrication of second-order non-linear optical (NLO) polymer films is electric field poling. The dipole moments of the NLO polymers can be aligned by an electric field. The polymer is heated and poled above the glass transition temperature (Tg), then cooled below the Tg under the electric field. After the field is turned off, a net dipole moment can be locked into the film as long as the temperature remains well below the Tg. This imparts a noncentrosymmetry to the film which is necessary for important nonlinear optical properties.

Only recently have investigators paid close attention to dipole moments in rigid mainchain polymers. Polymers containing rigid chromophores in the main chain have been reported. Some of this effort was motivated by a search for superior nonlinear optical polymers. In these cases the mainchain repeat unit was in the head-to-tail configuration (isoregic). Hence, alignment of these known polymers by means of an electric field would tend to stretch out the backbone into a locally extended conformation. (see formula [1])

As an illustration, consider the polymer in the molten state near its glass transition temperature during electric-field poling. Under these conditions, the energy barriers to rotate and to align mainchain chromophores configured head-to-tail are so great that the degree of alignment has been shown to be less than that achieved in corona-poled sidechain chromophoric polymers under the same poling conditions. For the case of electric-field poling, to form useful nonlinear optical, piezoelectric or pyroelectric films, the accordion polymers of the present invention are superior to the known mainchain polymers because the degree of alignment of the chromophores will be higher in the accordion polymers.

The head-to-head pairs of chromophores with short flexible bridging groups of the present invention allow the polymer chain to "wrinkle" into an accordion conformation (above the glass transition temperature) under the influence of an electric field and to achieve a higher degree of alignment than can be attained with the head-to-tail (isoregic) chain. This accordion conformation is locked into the solid state by cooling the polymer in the electric field below its glass transition temperature. Once cooled down, the electric field is turned off and the folded conformation remains frozen in place for years, or until the polymer is reheated or stretched beyond its yield point.

Langmuir-Blodgett (LB) Deposition.

The Langmuir-Blodgett deposition process is well known in the art. Simply stated, an organic compound is floated on a liquid (usually water) surface, and a solid substrate is dipped through the interface depositing a single molecular layer per stroke on the substrate. The technology has matured to the point of having many commercial suppliers of computer-automated LB troughs.

Multilayer LB films can be formed in three different configurations, as illustrated by the formulas:

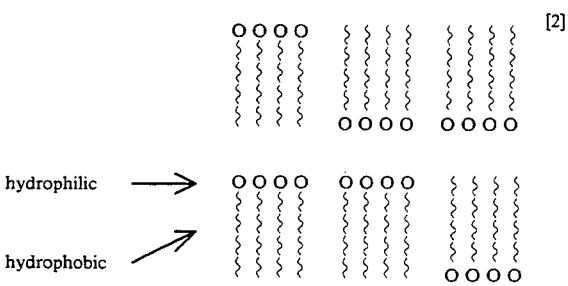

[2]

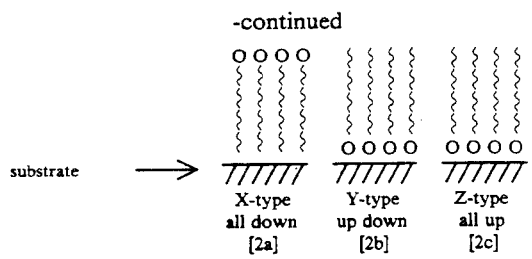

X-type all down [2a]    Y-type up down [2b]    Z-type all up [2c]

Historically these are called "X"-, "Y"- and "Z"-type films, where X is made by depositing always on the down-stroke, Z is made by depositing always on the up-stroke, and Y is made by alternating up- and down-strokes. For the case in which the large dipole moment of the sidechain chromophore is normal to the polymer backbone (and the backbone is in the plane of the air-water interface), all-up or all-down films will be polarized, and the up-down films will not be polarized (dipoles in adjacent layers cancel out). The Y configuration is thermodynamically more stable (sometimes X and Z configurations spontaneously rearrange in the solid state to the Y configuration). Hence, one may interleave a sidechain chromophoric polymer with an optically inert spacer layer (having little dipole moment) and arrive at a stable, polarized film in the Y configuration.

One can purchase LB troughs equipped with two compartments such that multilayer films, alternating $(AB)_n$ times, can be deposited automatically.

The bridging groups of the accordion polymers of the present invention can be selected to facilitate alignment on a LB trough For example, the degree of hydrophobicity (or hydrophilicity) of alternating bridging groups and the dipole of the main-chain repeat units can be tailored to achieve the desired orientation of the monolayer on the water surface. By deposition of these monolayers onto solid substrates, the polarized conformation of the accordion polymers can be maintained in multilayered films which will exhibit nonlinear optical properties, piezoelectric and pyroelectric properties.

Uses for NLO polymers.

Uses for the nonlinear optical properties include changing the direction, frequency, phase, polarity or amplitude of a laser beam transmitted through the polymer by incorporation of the polymer into a Pockels cell, an interferometer, an optical switch or an optical modulator. Piezoelectric materials convert pressure-volume energy or mechanical force into electrical energy (or vice versa) and can be used in pressure sensing (or sending) devices, such as accoustic membranes for speakers or sonar devices. Pyroelectric materials convert thermal energy into electrical energy (or vise versa) and are useful in devices used for sensing heat. As second-order nonlinear optical materials, these polymeric accordion polymers are especially useful for three-wave optical mixing. (See, Y. R. Shen, *The Principals of Nonlinear Optics*, John Wiley & Sons: New York, 1984)

SUMMARY OF THE INVENTION

The present invention describes polymers in which the backbone repeat units are designed to assemble into a locally folded accordion conformation, i.e., the long axis of the rigid main-chain units is essentially perpendicular to the axis of the polymer chain. This locally folded accordian conformation can be illustrated by the formula:

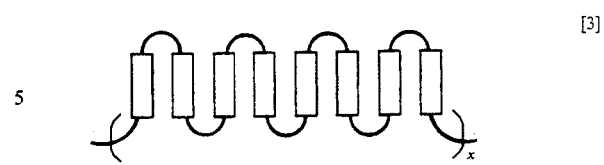

where the rectangles represent rigid, linear, mainchain repeat units (e.g., mesogens, chromophores, etc.) and the semicircle loops represent bridging units (e.g., flexible polyalkylene hydrocarbons or fluorocarbons, polyalkylene ethers, polyalkylsiloxanes,or rigid groups such as 1,2-phenyl, 1,2-xylyl, 1,2-cyclohexyl, etc.).

The folded structures of the present invention are to differentiated from those in the well known case of crystalline polymers, such as polyethylene, in which tens of repeat units fold back in unison to form lamellar crystals. In the known folded chain cases, most of the backbone repeat units, in a local sense, are in the extended conformation, and the distance between folds is larger than that of the present invention. Furthermore, the polymers of the present invention also can be designed to have the ground-state dipole moments of the long axis of the chromophores always pointing in the same direction in the folded conformation.

For polymers of the present invention, the folding can be assisted by electric-field poling or Langmuir-Blodgett (LB) processing. Hence, it is important to the present invention that molecular structures which facilitate the formation of the folds and give stability to the folded assembly be included. The term "accordion polymers" is used to identify the new compositions of the present patent application.

DETAILED DESCRIPTION OF THE INVENTION AND PREFERRED EMBODIMENTS

The accordion polymers of the present invention are characterized by the repeating unit illustrated by the formula:

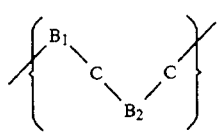

wherein $B_1$ and $B_2$ are bridging units;

where C is a chromophore repeat unit;

wherein adjacent pairs of said chromophore repeat units are in a head-to-head (or syndioregic) configuration, with respect to their ground-state dipole moments along the polymer backbone.

Said polymers, upon spin-casting from solution, baking and electric field poling, or upon self-assembly on a surface, assume a polar, noncentrosymmetric conformation as evidenced by one or more of the following attributes: a second-order nonlinear optical property (such as second harmonic generation), a piezoelectric property, or a pyroelectric property.

A preferred embodiment can be illustrated by the formula:

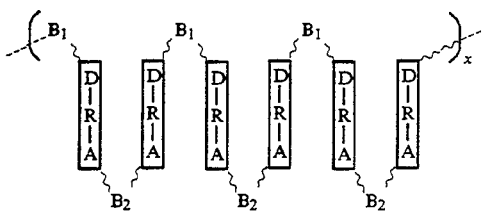

[5]

where $B_1$ and $B_2$ are bridging units;

where A is an electron accepting group; and, where D is an electron donating group and R is a rigid connecting group, containing delocalized pi electrons.

The rigid connecting groups must be pi-conjugated and provide a pi-conjugated electron path directly coupling the donor and acceptor groups.

In the case of $B_1$, each of the two dangling bonds are attached to the electron donating end of a main-chain unit; and wherein for the case of $B_2$, each of the two dangling bonds are attached to the electron accepting end of a main-chain unit; wherein the ground-state dipole moments of the main-chain units, are at least 2 Debyes.

In each case the strategy is to connect two donor groups and or two acceptor groups with a bridging groups, then form the syndioregic polymers in a second reaction.

Another embodiment adds "helper" groups, $H_1$ and $H_2$, which tend to associate through van der Waals forces, hydrogen bonding, etc., thus facilitating self-assembly of the accordion structure:

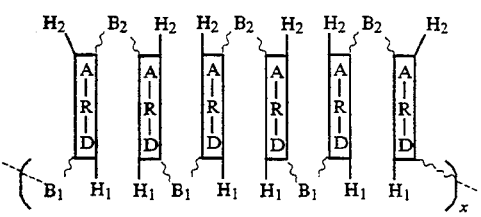

[6]

where $H_1$ may also be hydrophobic and $H_2$, hydrophilic (or vise versa), to facilitate self-assembly into the accordion conformation on a Langmuir-Blodgett trough, (without the need for electric field poling).

Polymers of the present invention can also be designed with essentially no dipole moments where only the hydrophilic-hydrophobic or hydrogen bonding interactions cause the polymer to self assemble (in the melt or on a water surface):

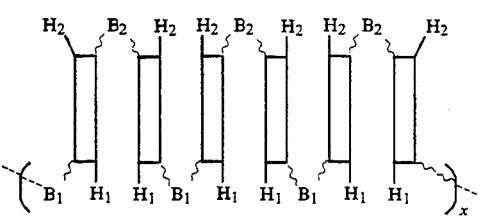

[7]

where $B_1$, $B_2$, $H_1$, and $H_2$ are as previously defined

A further embodiment of this invention involves a means to chemically crosslink one chain to another, or to connect one monolayer to the next in the case where monolayers are built up, one upon the next, by the LB process. A generic example of this case is illustrated by the formula:

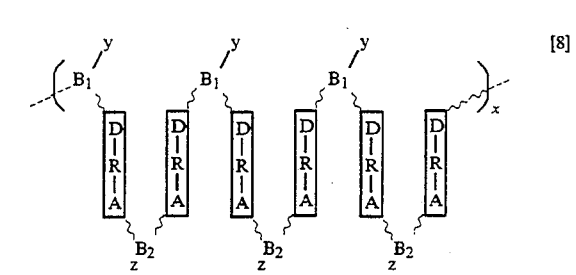

[8]

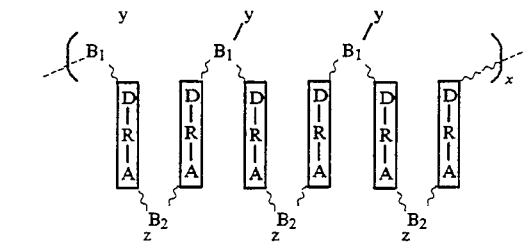

where $B_1$, $B_2$, R, D, and A are as previously defined; and, where z and y are reactive groups (z reacts with y), such as carboxyl and epoxy groups.

It requires energy to unfold and stretch the accordion conformation. From a mechanical point of view this useful because the energy that goes towards the unfolding might otherwise have been used to break covalent bonds. The polymers of the present invention are tougher and more ductile than conventional engineering plastics and the known liquid crystalline polymers. Hence, they may be useful in molded structural parts, and as binders and matrices in composite materials.

Bridging groups.

The bridging groups, $B_1$ and $B_2$, are selected, not only to connect the chromophores, but also to point or hold the chromophores in a polar conformation, once the polymer is formed. Other polymer properties which are important for various applications are the index of refraction, the glass transition temperature and the hydrophobicity. These properties can be altered by the selection of $B_1$ and $R_1$.

Examples of bridging groups, B, and their relative properties:

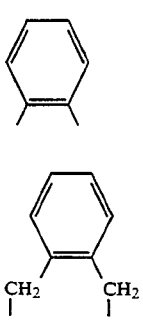

[9]

I

II

-continued

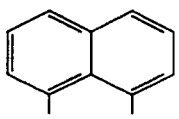

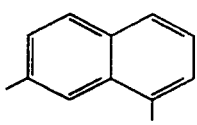

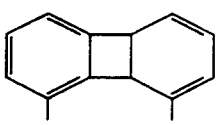

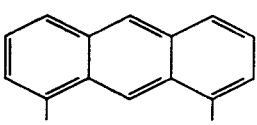

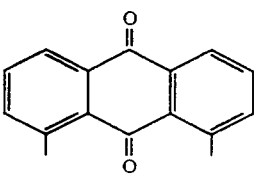

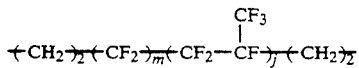

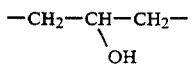

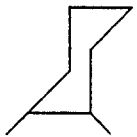

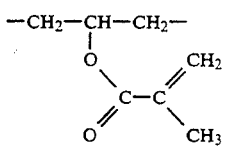

wherein n is selected from 1 through 12, m is selected from 2 through 12 and j is selected from zero through two.

(Note: unconnected lines are dangling bonds not methyl groups)

Properties of the above examples of B, are shown in Table 1 below.

TABLE 1

| B group | hydrophobicity | index of refraction | glass transition temperature |
|---------|----------------|---------------------|------------------------------|
| I | low | high | high |
| II | low | moderate | moderate |
| III | low | high | high |
| IV | low | high | high |
| V | low | high | high |
| VI | low | high | high |

TABLE 1-continued

| B group | hydrophobicity | index of refraction | glass transition temperature |
|---------|----------------|---------------------|------------------------------|
| VII | moderate | high | high |
| VIII | high | moderate | moderate |
| IX | high | low | low |
| X | low | low | moderate |
| XI | high | moderate | high |
| XII | moderate | moderate | high |

Increasing the aromaticity of the bridging group increases the index of refraction and the glass transition temperature. Adding hydroxyl, carboxyl and other hydrogen bonding substituents to the bridging group, increases the hydrophilicity (decreases the hydrophobicity). These groups can also be useful for subsequent crosslinking reactions which give the polymer films more stability.

Electron Donating Groups

Alkyl- and aryl-substituted nitrogen, oxygen and sulfur provide excellent electron-donating capability when directly attached to the chromophore. Sulfur has more electrons than oxygen which adds to the polarizability of the molecule. Ether oxygen is quite inert to harsh conditions and provides low absorption loss. Alkyl substituted amines are among the strongest electron donating groups available.

The following scheme provides starting materials for the electron-donor end of several classes of syndioregic polymers:

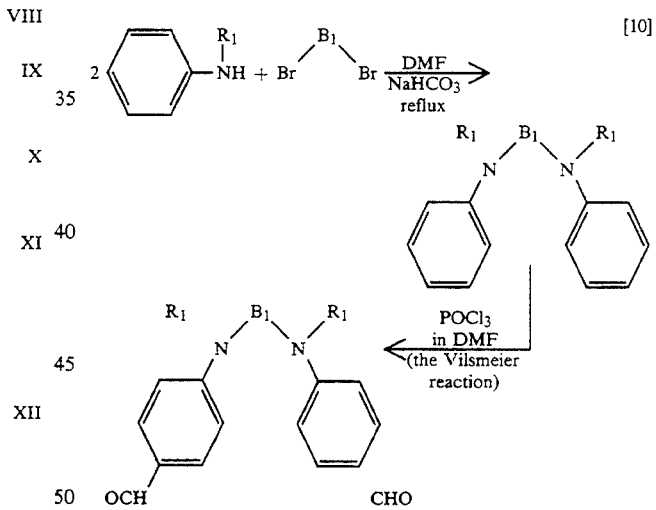

[10]

This generic reaction can also be used to attach oxygen and sulfur donating groups to the chromophore in place of the amine. Amines also have an another valence bond; hence, in addition to being an electron donor and a bridging link, amines provide a site for attaching another group, $R_1$, that may be useful in adjusting the solubility, hydrophobicity and thermal properties of the polymer.

Electron Accepting Groups.

The electron accepting groups must be thermally stable, and be attached to both a chromophore and a bridging group. Below are specific examples of several classes of electron-acceptors and chromophores with generic bridging groups. The ether electron-donating group is used in each case for simplicity, although amine or sulfide may be preferred in some cases:

Examples of electron accepting groups:

[11]
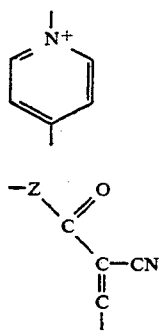
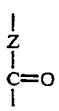
[11] I
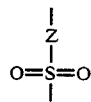
IV
V
where Z=NH or O
Examples of chromophores:
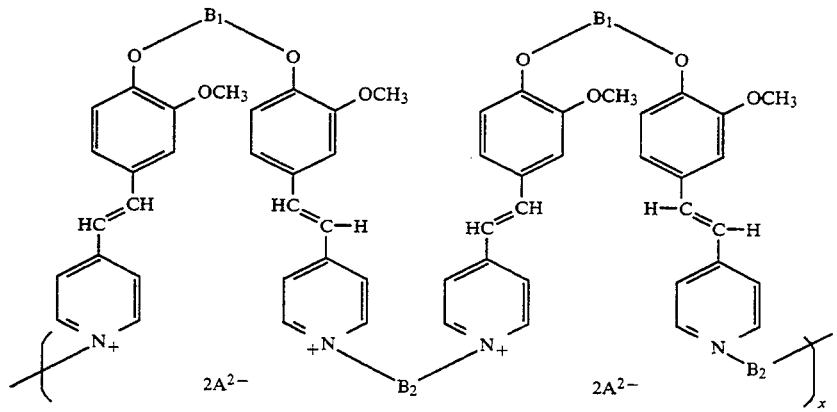
[11a]
III Stilbazolium chromophore with pyridinium accepting group.
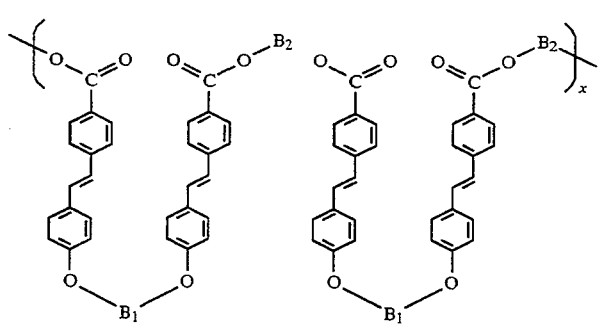
[12]
Stilbene chromophore with carbonyl accepting group.
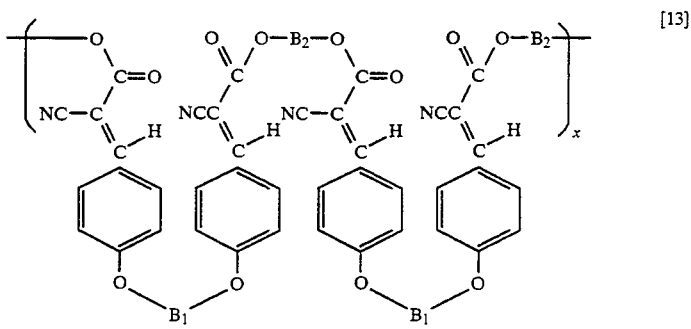
[13]

Cyanocinnamate chromophore with carbonyl and cyano accepting groups.

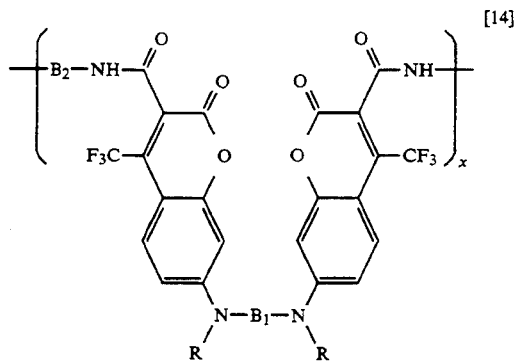

Coumaro chromophores with carbonyl, cyano and trifluoromethyl accepting groups, where R is an alkyl of 1-22 carbon atoms.

The following examples for the preparation of precursors and polymers are provided for illustration and do not limit the scope of the invention. Chemical reactions used to make the polymers of the present invention are described in many textbooks on organic chemistry. See, e.g., Jerry March, *Advanced Organic Chemistry: Reactions, Mechanisms and Structure*, 2nd Edition, McGraw-Hill: New York, 1977. The reaction schemes for making poly(α-cyanocinnamamides will be given first. It should be noted that the reaction schemes for making the donor end of the chromophores are also used as the starting materials for several of the other polymers, such as those with the stilbene and stilbazolium chromophores.

POLY(α-CYANOCINNAMATES) AND POLY(α-CYANOCINNAMAMIDES) (PCCM)

Reaction Schemes. PCCM have been made by (1) transesterifications and transamidations, or (2) Knoevenagel condensations. In the former case, esters (or amide) of cyanoacetic acid are condensed with the bisaldehydes, generically shown in formula [13], to form tail-to-tail-linked chromophoric precursors to the syndioregic polymers. The new bis-ester (or bis-amide) is then polymerized with a diol (or diamine) containing the other bridging group to form the polymer. In the case of the Knoevenagel polymerization, the diol (or diamine) containing a bridging group is reacted with ethyl cyanoacetic ester, which is then reacted with the bisaldehyde containing the other bridging group to form the same polymer. These two generic reactions are shown below:

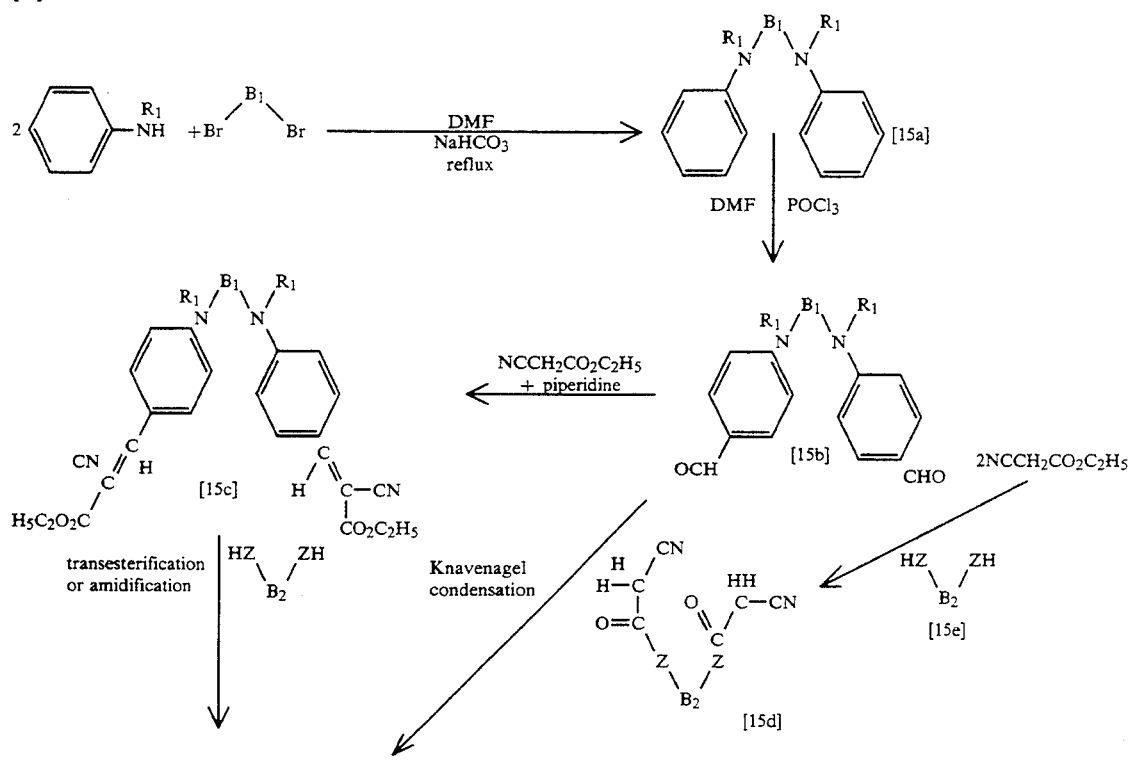

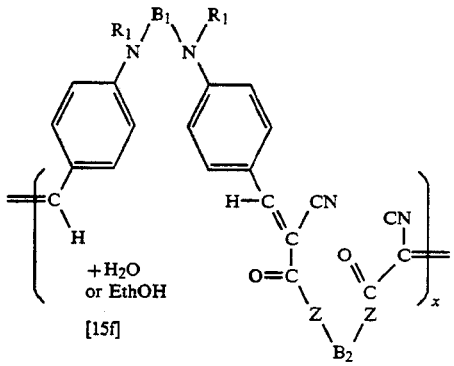

where Z is -O- or -NH-.

Example I

Preparation of [15c] with $B_1 = -(CH_2)_n-$, $n=3$:

Step 1. Preparation of [15a].

N-Ethylaniline (40.2 g, 0.333 mol), 32.0 g (0.158 mol) of 1,3-dibromopropane, 29.1 g of sodium bicarbonate and 240 ml of dimethylformamide were refluxed with stirring for 24 h. After cooling, the mixture was poured over 500 g of ice, 300 ml of water, 90 ml of ethanol and 19 g of sodium carbonate. The oil was taken up in 300 ml of ether and separated from the aqueous phase; the latter was reextracted with 200 ml more of ether. The combined ethereal solutions were washed twice with 100 ml portions of cold water, dried over anhydrous potassium carbonate, filtered and evaporated; 42.4 g of a dark oil.

Step 2. Preparation of [15b].

Dry dimethylformamide (95 ml) was cooled in an ice-water bath under a drying tube. With stirring and continued cooling 49.0 g of phosphorous oxychloride was added dropwise over 47 min. After this solution had been stirred for another 103 min, all of the above oil was added over 22 min. The reaction mixture was then removed from the cooling bath and stirred at room temperature for 1 h. It was then placed in an oil bath preheated to 90° C. and held 80°-90° C. for 2 h. After the cooled solution had been quenched on 200 g of ice plus 50 g of water, 105 g of anhydrous sodium acetate was stirred in. The olive colored oil, which separated initially, solidified upon standing overnight at 5° C. The cake was broken up, 50 ml of very cold 10% aq. sodium hydroxide added with vigorous stirring, and the product filtered and washed well with cold water. The still wet cake was recrystallized from 450 ml of ethanol. Cooling to 25° C. furnished 19.3 g (36%) of greenish yellow dialdehyde after filtering, washing with cold ethanol and vacuum drying at 70° C., 25 mm; mp 109°-112° C., wetting and changing at 106° C. An additional 1.8 g was recovered by cooling the mother liquors at 5° C. for several days. Recrystallizing 2 g from 50 ml of ethanol with C-decolorization raised the mp to 113°-114° C.

Anal. Calcd for $C_{21}H_{26}N_2O_2$: C, 74.52; h, 7.74; N, 8.28. Found: C, 71.31; H, 7.85; N, 8.39, 8.32.

Step 3. Preparation of [15c].

The crude dialdehyde from step 2 (3.4 g) was dissolved in 75 ml of hot abs ethanol, 2.4 g of ethyl cyanoacetate was added, then 10 drops of piperidine. The mixture stood at room temperature for 11 days, with an occasional reheating to boiling. The orange-yellow solid was filtered, washed with cold ethanol, and vacuum dried; 4.36 g (82%), mp 143°-148° C. Very little more crystallized when the mother liquors were cooled at −15° C. The bis-cyanocinnamate was very soluble in acetonitrile.

Step 4. Recrystallization

All of the crude diester was recrystallized from 130 ml of abs ethanol plus 20 ml of acetonitrile; yellow-orange crystals, mp 148°-151° C., changing 146°-148° C.; 3.15 g (72% recovery).

Anal. Calcd for $C_{31}H_{36}N_4O_4$: C, 70.43; H, 6.86; N, 10.60. Found: C, 70.73; H, 6.98; N, 10.67.

The following compounds were made in three steps by procedures similar to those described in Example I. Yields of the bis-cyanocinnamate esters were in most cases low (10-20%) because neither the $\alpha$, $\omega$-dianilino-alkanes nor the dialdehydes derived from them were purified before the condensation of the latter with ethyl cyanoacetate.

Example II

Preparation of [15c] with $B_1 = -(CH_2)_n-$, $n=6$

Steps 1 through 3 of Example I were essentially followed except that $B_1 = -(CH_2)_n-$ and $n=6$.

Recrystallization of this diester from ethanol (100 ml/1 g) gave rosettes of yellow needles; mp 125°-127° C., slight wetting and changing about 121° C. If plunged into a bath at 124° C., the compound partially melted, then resolidified before remelting. The 1H NMR spectrum was satisfactory.

Anal. Calcd for $C_{34}H_{42}N_4O_4$: C, 71.55; H, 7.43; N, 9.82. Found: C, 71.88; H, 7.46; N, 9.76.

Example III

Preparation of [15c] with $B_1 = -(CH_2)_n-$, $n=10$

Steps 1 through 3 of Example I were essentially followed except that $B_1 = -(CH_2)_n-$ and $n=10$.

This diester was made in the usual way in 30% yield from very crude dialdehyde. Recrystallization from abs. ethanol (250 ml/4.4 g) gave 3.0 g of yellow powder; mp 105°-107° C., slight wetting and shrinking at 103° C. The $^1$H NMR was consistent with that expected.

Example IV

Preparation of [15b] with $B_1 = -(CH_2)_n-$, with $n=2$

Steps 1 through 2 of Example I were essentially followed except that $B_1 = -(CH_2)_n-$ and $n=2$.

Felted masses were obtained after recrystallization from ethanol (300 ml/2.9 g); 65% recovery; mp 90°-93° C.

Example V

Preparation of 3 with $B_1 = -(CH_2)_n-$, with $n=2$

Step 3 of Example 1 was essentially followed except the dialdehyde used was 2 from Example IV.

Fine yellow needles from ethanol; mp 79°–81° C.

REACTIONS WITH VANILLIN TO FORM ACCORDION POLYMERS HAVING THE GENERAL FORMULA

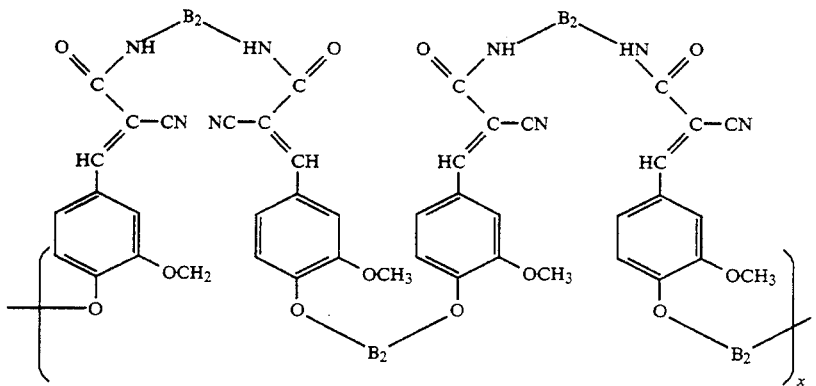

[16]

were prepared using the reaction scheme:

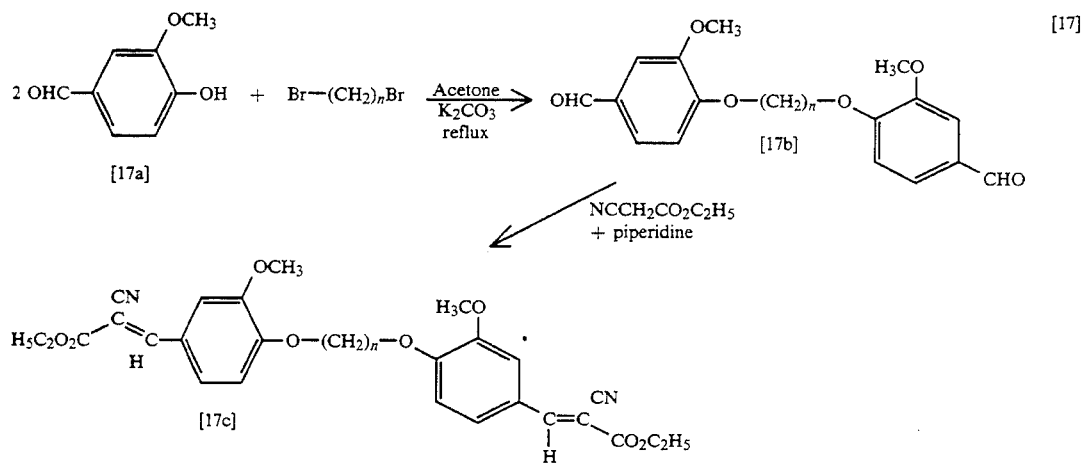

Example VI

Preparation of [17b] with $n=10$:

1,10-Di(2-methoxy-4-formylphenoxy)decane:

A slurry of 13.42 g of vanillin, 11.99 g of 1,10-dibromodecane, 6.16 g of anhydrous potassium carbonate and 300 ml of acetone was refluxed with stirring for 48 h, cooled and diluted with 400 ml of water. After the salts had dissolved, the mixture was chilled overnight at 5° C. The solid product was filtered, washed twice with water and recrystallized (still wet) from 250 ml of ethanol. Cooling to 25° C. gave 4.75 g of compound mp 93°–102° C., wetting at 65° C. (Further cooling of the mother liquors to 5° C. furnished 3.5 g of very impure materials, mp 55°–65° C.). Another recrystallization from 130 ml of ethanol raised the mp to 103°–105° C., slight wetting at 99° C.; 3.16 g.

Example VII

Preparation of [17c] with $n=10$:

Ethyl cyanoacetate (0.53 g; 4.7 mmol) and 0.93 g (2 mmol) of the dialdehyde of Example VI were dissolved in 75 ml of hot, abs ethanol and treated with 8 drops of piperidine. After several hours at room temperature pale yellow solid began to crystallize. The mixture stood for 3 days with occasional warming to a boil. The diester was filtered, washed with ethanol and dried; 0.9 g, mp 131°–133° C. It is poorly soluble in ethanol and soluble in toluene or chloroform. After recrystallization from 40 ml of dry acetonitrile, the m.p. was 135°–137° C.

Anal. Calcd for $C_{36}H_{44}N_2O_8$: C, 68.33; H, 7.01; N, 4.43. Found: C, 68.41; H, 7.13; N, 4.44.

Example VIII

Preparation of [17 b] with $n=4$:

1,4-Di(2-methoxy-4-formylphenoxy)butane:

The dialdehyde was prepared using essentially the same preparation as Example VI except 1,4 dibromobutane was used instead of the 1,10 dibromodecane. The yield of this dialdehyde after one recrystallization from acetonitrile was 54%; coarse white grains; mp 154°–156° C. The $^1H$ NMR spectrum was consistent with that expected for the title compound.

Anal. Calcd for $C_{20}H_{22}O_6$: C, 67.03; H, 6.19. Found: C, 66.73; H, 6.25.

Example IX

Preparation of [17c] with n=4:

The preparation of Example VII was essentially followed except that the dialdehyde used was the dialdehyde prepared in Example VIII. The di(α-cyanocinnamate)ester derived from this dialdehyde was recrystallized from dimethyl sulfoxide since it poorly soluble in hot acetonitrile, acetonitrile plus ethanol, ethanol or benzene; mp 208°-209° C.; yellow felted masses; 70% yield.

Anal. Calcd for $C_{30}H_{32}N_2O_8$: N, 5.11. Found: N, 5.14.

SYNTHESIS OF FLUORINATED ACCORDION POLYMERS HAVING THE FORMULA

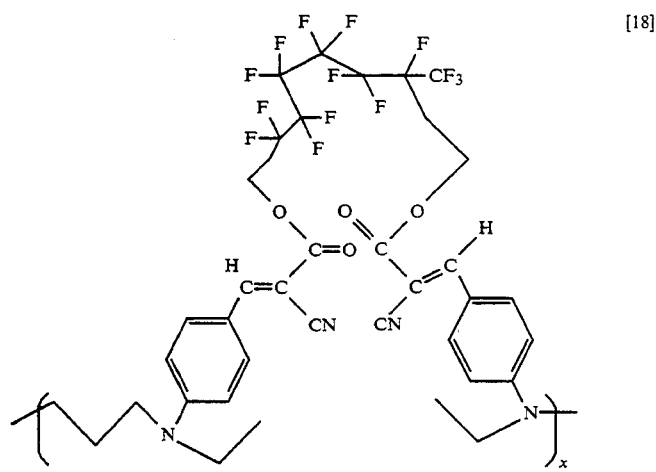

[18]

Example X

Into a 15 ml RB flask with stir bar were placed 0.4478 g (1.1 mmol) of the fluorinated (440 g/mol) diol having the formula:

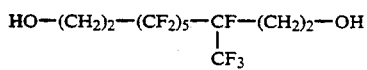

5881 g (1.1 mmol) of the diester ([15c] where $B_1=(CH_2)_3$ and $R_1$=ethyl) and 1 drop (0.1 mmol) of dibutyl tindilaurate. Contents were heated to 165 C. under nitrogen purge for 1 hour, then hooked up to vacuum pump for 12 hours. The contents were then cooled, dissolved in chloroform. The polymer was purified by precipitation of this solution into hexane. The polymer was then dried for 24 hours at 90° C. Molecular weight was found to be 20,000 according to preparative Gel Permeation Chromatography.

Example XI

Into a 15 ml RB flask with stir bar were placed 0.390 g (0.67 mmol) of the fluorinated (590 g/mol) diol having the formula:

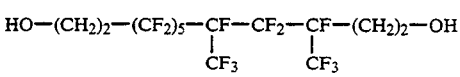

0.4156 g of the diester (0.67 mmol) ([15c] where $B_1=(CH_2)_{10}$ and $R_1$=ethyl) and 1 drop (0.1 mmol) of dibutyl tindilaurate. Contents were heated to 165° C. under nitrogen purge for 1 hour, then hooked up to vacuum pump for 12 hours. The contents were then cooled, dissolved in chloroform. The polymer was purified by precipitation of this solution into hexane. Tg of this polymer was 45° C.

PREPARATION OF POLYMERS HAVING THE GENERAL ORMULA

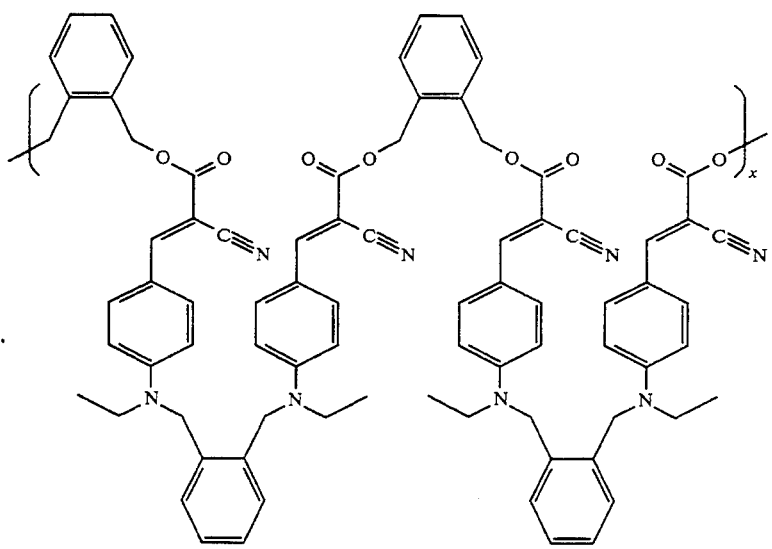

[19]

and the ratio of aromatic protons to aliphatic methylene protons was 9:4. The elemental analyses agree with this assignment.

Example XII

Bis-(cyanoacetyl) ester of 1,2-Benzenedimethanol. ([15d] where $B_2$ is ortho xylyl and Z=—O—)

A slurry of 2.64 g (0.01 mole) of $\alpha,\alpha'$-dibromo-o-xylene, 2.36 g (0.022 mole) of sodium cyanoacetate and 10 mL of dimethylformamide was stirred at room temperature for 42.5 hr; the character of the solid changed. After heating for 8 hr on the steam bath, the mixture was cooled, and poured over 25 g of ice plus 15 mL of water. A gum separated but soon solidified; it was broken up, filtered, washed will with water and dried; 2.63 g (97% yield), mp 60°–70° C. Recrystallization from 60 mL of benzene yielded 1.1 g of pale yellow plates and rosettes, mp 78°–79.5° C., after cooling to 5° C., filtering, washing with hexane and vacuum drying at 25° C. The same diester, mp 79.5°–80.5° C., was made from 1,2-benzenedimethanol and cyanoacetic acid using the dicyclohexylcarbodiimide route.

Anal. Calculated for $C_{14}H_{12}N_2O_4$; C, 61.75; H, 4.44; N, 10.29. Found: C, 61.38, H, 4.38; N, 10.15.

Example XIII $\alpha\alpha'$-Di-N-ethyl-N-(4-formylphenyl)amino-o-xylene. ([15a] where $B_1$ is ortho xylyl)

A mixture of 26.4 g (0.1 mole) of a,a'-dibromo-o-xylene, 24.3 g (0.2 mole) of N-ethylaniline, 18.0 g of sodium bicarbonate and 150 mL of dimethylformamide was refluxed with stirring for 24 hr. There was much foaming initially. After cooling to 25° C., the mixture was poured over 300 g of ice, 200 Ml of water and 8.3 g of potassium carbonate. Since the separated product did not solidify, it was extracted into methylene chloride (1×200 mL, 1×100 mL), dried over anhydrous potassium carbonate, filtered and evaporated. The semi-solid mass was slurried with 50 mL of methanol and cooled to −15° C. The crystalline product was filtered promptly, washed with 20 mL of −15° C. methanol, and dried; 12.7 g (mp 164°–166° C.) was recovered. Recrystallization of 7.2 g from 750 mL of ethanol gave 5.75 g of white plates, mp 167°–168° C. This fraction, which was discarded, is probably N-phenylisoindoline since the $^1$H NMR spectrum showed no ethyl groups Anal. Calculated for $C_{14}H_{13}N$: C, 86.12; H, 6.71; N, 7.18. Found: C, 85.63; H, 6.84; N, 7.16.

When the methanolic mother liquors and washings were further cooled, another material (8.3 g, 24%) crystallized; mp 72°–73° C. After recrystallization form 160 mL of ethanol, 7.0 g (20.4%) of the desired diamine, mp 73°–74° C., was recovered. Its $^1$H NMR spectrum showed the presence of ethyl groups.

Anal. Calculated for CHN: C, 83.67; H, 8.19; N, 8.13. Found: C, 83.57; H, 8.25; N, 8.18.

By reworking the methanol mother liquors, another 6.8 g (6.2%) was isolated.

Example XIV

Vilsmeier conditions: Preparation of [15b].

With stirring and cooling in an ice-water bath, 6.8 g of phosphorous oxychloride was added over 5 min. to 14 mL of dry dimethylformamide, protecting the reaction from moisture with a calcium chloride drying tube. After stirring in the cooling bath for 2.5 hr., 6.3 g of the above diamine, mp 72°–73° C., was added over 5 min. This solution was stirred at 25° C. for 1 hr. it was poured onto 39 g of ice, 17 g water and 15 g sodium acetate. The yellow gummy product, which separated, solidified after chilling overnight at 5° C. It was broken up, filtered and washed with water. After drying at room temperature, it was recrystallized twice from 125 mL of ethanol; 4.64 g (64%) of the title compound as green-yellow plates, mp 130.5°–131.5° C.

Anal. Calculated for $C_{26}H_{28}N_2O_2$: N, 7.00. Found: N, 6.91. The red bis-4-nitrophenylhydrazone melted at 257°–259° C. The pale yellow, bis Schiff base derived from 4-anisidine melted at 166°–167° C.

Anal. Calculated for $C_{40}H_{42}N_4O_2$: C, 78.66; H, 6.93; N, 9.17. Found C, 78.81; H, 6.95; N, 9.06.

Example XV

Knoevenagel polymerization of products from XIV and XII.

Into a 15 ml RB flask with stir bar were placed 0.272 g (1 mmol) of the dicyano of Example XII, 0.4006 g of the dialdehyde of Example XIV (1 mmol), 6 drops of piperdine, 12 drops of glacial acetic acid and 15 ml of toluene. The contents were refluxed for 4 days. The solids were dissolved in hot meta cresol, precipitated into methanol. Tg of this material was found to be 110 C.

Example XVa

On a milligram scale (0.01 mmol) the above monomers of Example XV were heated from R.T. to 300 C at 10 C/min in a DSC cell with nitrogen purge. After the fourth heat a Tg of 104 C was seen. We know now that this polymer decomposes at 230 C.

Example XVb

Into a 15 ml RB flask with stir bar were placed 0.087 g (0.32 mmol) of the dicyano of Example XII, 0.128 g of the ialdehyde of Example XIV (0.32 mmol), 0.04 g of 4-dimethylamino pyridine, DMAP, (0.32 mmol) 7 mo of dry THF was added and the mixture was refluxed for 24 hours. The flask was cooled, THF evaporated, and the contents were rinsed with hexanes. The polymer was dissolve in chloroform and run through the prep GPC; several fractions were taken. Mn was found to be 30,000. NMR end group analysis of the highest Mw (cut off around 25,000) fraction taken showed Mn of 50,000. The Tg of this fraction was found to be 145° C.

PREPARATION OF A POLYMER HAVING THE GENERAL FORMULA

266°-267° C. The $^1$H NMR spectrum was consistent with that expected.

The original ethanolic mother liquors were evaporated to dryness, leaving a gum. This was slurried with 50 mL of 1:1 ethanol-diethyl ether, the insolubles were filtered and washed once with 10 mL of mixed solvent and twice with 10 mL of ether; 2.7 g yield. When slurried with the acetonitrile recrystallization mother liquors from above and cooled to $-15°$ C., there was recovered 0.84 g (7.5%) more of the solid melting 262°-263° C. (trans-isomer Concentrating these mother liquors to 80 mL, cooling to 25° C. and allowing to stand, refiltering and cooling to 5° C. gave 0.31 g (2.8%) of solid, mp 202°-204° C. (cis-isomer) Its $^1$H NMR spectrum was also consistent with that expected for the bis-acetamido derivative, but it was different than that for the higher melting isomer. Another 0.2 g was obtained when the recrystallization liquors were cooled to $-15°$ C.

Example XVII

Diamino cyclohexyl polymer

Into a DSC pan were placed 2.4 mg of the (trans) dicyano of Example XIVI (0.01 mmol) and 4.0 mg of the dialdehyde of Example XIV (0.01 mmol). The pan and contents were heated from R.T. to 300 C. at 10 C./min. After the third heat a Tg of 190° C. was seen.

Example XVIIa

The polymerization of Example XVII was essentially

[20]

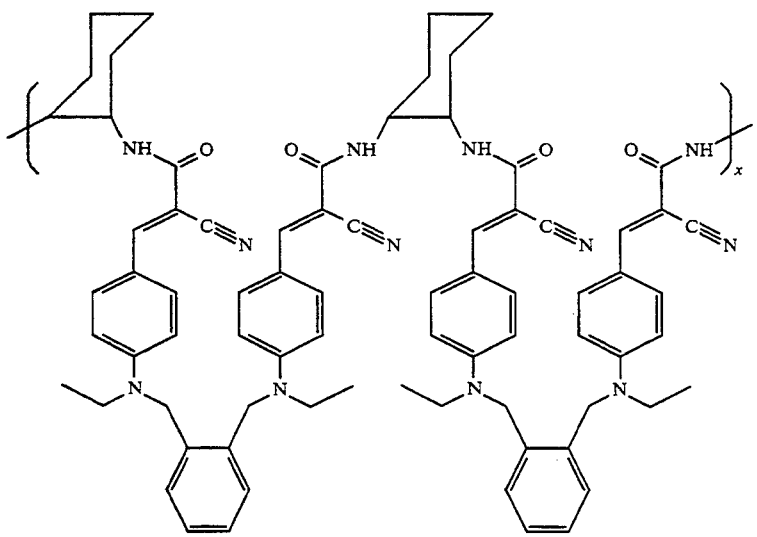

Example XVI 1,2-Bis-(cyanoacetamido)cyclohexane. ([15d] where B2=cyclohexane and Z=amine)

A solution consisting of 5.09 g of commercial 1,2-diaminocyclohexane (mixture of isomers from DuPont, Wilmington, DE), 10.54 g of ethyl cyanoacetate and 20 mL of abs. ethanol was refluxed for 18 hr. Some solid separated. After cooling to 5° C., the solid was filtered, washed with cold ethanol (the filtrate and washings were saved) and dried; 2.9 g (26.2%) yield, mp 264°-265° C. This crude product was boiled with 500 mL of acetonitrile, filtered from 0.41 g of solid, mp 266°-267° C., and the filtrate cooled to 5° C. The very fine needles were removed, washed with cold acetonitrile and vacuum dried at 70° C., 25 mm; 2.1 g, mp followed except that the dicyano used was formula {15d} where B2=—(CH$_2$—HCOH—CH$_2$)— and Z32 amine. A Tg of 175° C. was seen.

Example XVIIb

The polymerization of Example XVII was essentially followed except that the dicyano used was formula {15d} where B2=—(CH$_2$)$_2$— and Z=amine. A Tg of 157° C. was seen

Example XVIII

On a larger (0.16 mmol scale) the above (trans)cyano and dialdehyde of Example XVII were heated for 1 hour at 285° C. in a flask under nitrogen purge. The NMR analysis of this product gave an Mn of about 7100. Fast Ion Bombardment of the same product showed a molecular ion around 7500 (uncorrected).

Example XIX

Into a 15 ml RB flask with stir bar were placed 0.076 g (0.3 mmol) of trans dicyano of Example XVI, 0.140 g of the dialdehyde of Example XIV (0. mmol), and 0.04 g of DMAP (0.3 mmol). 7 ml dry THF and 3 ml dry acetonitrile were added. The contents were refluxed for 8 days with little evidence of reaction (colorless solution). After these 8 days, 5 ml of dry pyridine were added and the mixture refluxed for 4 more days. The solvents were evaporated and the residue heated to 245 C. in vacuo for 1 hour. A chloroform solution of the polymer was then run through the prep GPC. Mn 28,000 (GPC), 27,000 (NMR). Tg of the purified polymer was found to be 200.2° C.

Example XX

Into a 15 ml RB flask with stir bar were placed 0.0882 g (0.355 mmol) of the dicyano of Example XVI, 0.140 g of the dialdehyde of Example XIV (0.349 mmol), and 0.0517 g of DMAP (0.4 mmol). 7 ml of dry pyridine were added and the mixture refluxed for 3 days. The solvent evaporated and the residue was dissolved in chloroform and then precipitated into methanol. Tg of the purified polymer was found to be 208.5° C. NMR analysis showed Mn of 39,000.

SYNTHESIS OF POLYMERS HAVING THE FORMULA solid. The latter was slurried with 150 mL of boiling 8:2 abs. ethanol-dry acetonitrile, filtered form a trace of the urea derivative, and cooled to 25° C. The white felted needles were removed, washed with cold mixed solvent, and vacuum dried at 70° C., 25 mm; 0.34 g, mp 233°-234° C. (dec). A second crop of 0.15 g, mp 223°-225° C., was obtained by cooling the mother liquors to 5° C.

The solid (5.85 g after drying) melted at 207°-209° C. It was stirred overnight with 400 mL of acetonitrile, filtered from undissolved urea derivative, which was washed twice with 50 mL portions of solvent. Evaporation of the combined filtrates left 1.32 g of crude bisamide, which melted at 228°-229° C. after recrystallization from the same mixed solvent used above.

Anal. Calculated for $C_{12}H_{10}N_4O_2$: C, 59.50; H, 4.16; N, 23.13. Found The H NMR spectrum was consistent with that expected for the desired product.

Example XXII

Knoevenagel polymerization of products from XIV and XXI

The polymerization of Example XV was essentially followed except that the 1,2-Bis-(cyanoacetamido)benzene of Example XXI was used in place of the (trans)-dicyano of Example XVI.

[21]

Example XXI 1,2-Bis-(cyanoacetamido)benzene ([15d] where B2=phenyl)

A solution of 4.33 g (0.021 mole) of dicyclohexylcarbodiimide in 30 ml of dry acetonitrile was added dropwise with stirring over 20 min. to a solution of 1.08 g (0.01 mole) of 1,2-diaminobenzene and 1.79 g (0.021 mole) of cyanoacetic acid in 200 mL of dry acetonitrile. There was some warming and dicyclohexylurea precipitated. The addition funnel was rinsed with 10 mL of acetonitrole containing a few milligrams at ambient temperature before filtering off the solid (see below) which was washed once with 20 mL of acetonitrile. The combined filtrates were evaporated to leave 1.4 g of soft

SYNTHESIS OF A POLYMER HAVING THE GENERAL FORMULA

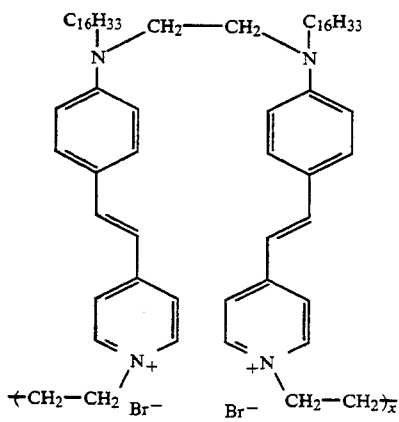

Example XXIII

A 50 mL round-bottom flask was charged with 0.5058 g N,N'-di(4-formylphenyl)-N,N'-di(hexadecyl) ethylenediamine (717.18 g/mol, 0.705 mmol); 0.2836 g 1,4-di[1-(4-methylpyridinium)] butane dibromide (402.17 g/mol, 0.705 mmol); 20.05 g chloroform and 5 drops piperdine. A condensor was connected to the flask, the flask was purged with nitrogen and the solution was heated to reflux and stirred magnetically for 42 hours. The solution began to darken in color after an hour and was very dark red in color after 3 hours of refluxing. No apparent increase in viscosity of the solution was observed. The polymer was purified by preparative gel permeation chromatography in chloroform solution using Styragel columns. The 4 highest molecular weight fractions (of the 8 fractions collected) were combined (minimum molecular weight 3000 g/mol relative to polystyrene standards) and the polymer was isolated by evaporating the chloroform. The sample was dried under reduced pressure (20 mTorr) at 160° C. for 3 hours. A yield of 0.230 g was obtained.

The polymer was characterized for amphiphilicity by spreading a chloroform solution of the polymer (1.0 mg/mL) at the air/water interface of a Langmuir trough. The spread monolayer was compressed and a collapse pressure of 48 mN/m was measured at a area (per repeat unit or pair of chromophores) of 85 sq. Angstroms.

PREPARATION OF A POLYMER HAVING THE GENERAL FORMULA

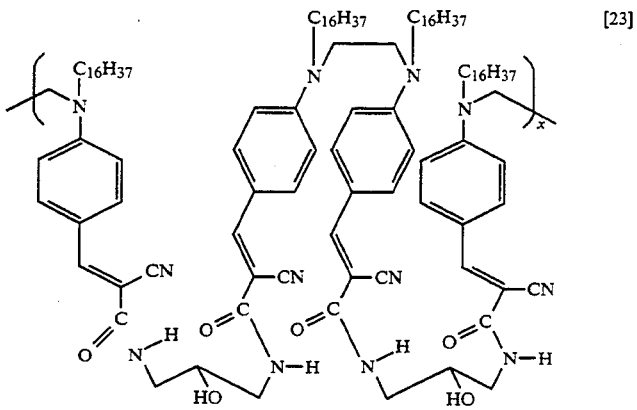

EXAMPLE XXIV

α,α'-Di-N-hexadecyl-N-(4-formylphenyl)amino-ethylene
Preparation of [15a].

N,N'-diphenyl ethylene diamine, α-hexadecyl iodide, sodium bicarbonate and diemthylformamide was refluxed with stirring for hr. After cooling to 25° C., the mixture was poured over 300 g of ice, 200 Ml of water and 8.3 g of potassium carbonate.

Vilsmeier conditions

Preparation of [15b] where $B_1 = -(CH_2)_2-$ and $R_1 = C_{16}H_{37}$.

With stirring and cooling in an ice-water bath, 6.8 g of phosphorous oxychloride was added over 5 min. to 14 mL of dry dimethylformamide, protecting the reaction from moisture with a calcium chloride drying tube. After stirring in the cooling bath for 2.5 hr., 6.3 g of the above diamine, mp 72°–73° C., was added over 5 min. This solution was stirred at 25° C. for 1 hr. it was poured onto 39 g of ice, 17 g water and 15 g sodium acetate. The yellow gummy product, which separated, solidified after chilling overnight at 5° C. It was broken up, filtered and washed with water. After drying at room temperature, it was recrystallized twice from 125 mL of ethanol; 4.64 g (64%) of the title compound as green-yellow plates, mp 130.5°–131.5° C.

Anal. Calculated for $C_{426}H_{28}N_2O_2$: N, 7.00. Found: N, 6.91.

Example XXVI

N,N'-Di(cyanoacetyl)-1,3-diaminopropanol-2.
Preparation of [15d] where

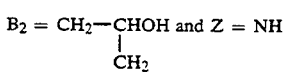

Ethyl cyanoacetate (22.99 g, 0.204 mole) was added all at once to 9.01 g ethanol. Since there was some warming, the reaction was moderated by letting the flask sit in a large beaker of cold water. Within 15 minutes a white solid began to crystallize; after three days at 25° C., the sold cake was boiled with 450 mL of ethanol and filtered hot from 17.6 g of undissolved solid (mp 165°–166° C.). Cooling the filtrate to 5° C. furnished 2.7 g of fluffing, flat, white needles, mp 165°-166° C. after drying at 70° C., 25 mm. The total yield was 90.5% of theory. When 4.2 g of the ethanol-extracted solid was recrystallized from 300 mL of acetonitrile, the mp was raised to 166.5°-167.5° C.'; 3.5 g recovery.

Example XXVII

Knoevenagel polymerization of products from XXV and XXVI.

The polymerization of Example XVII was essentially followed except that the N,N'-Di(cyanoacetyl)-1,3-diaminopropanol-2 of Example XXVI was used in place of the (trans)dicyano of Example XVI and the dialdehyde of Example XXV was used instead of the dialdehyde of Example XI. A Tg of 170° C. was seen.

POLYMERS WITH MORE FLEXIBLE SPACERS

There are uses for more flexible polarized films in piezo and pyroelectric applications. In order to impart low modulus and flexibility, the accordion structure can be incorporated into a block copolymer, for example, having the structure depicted here:

PREPARATION OF POLYMERS HAVING THE GENERAL FORMULA

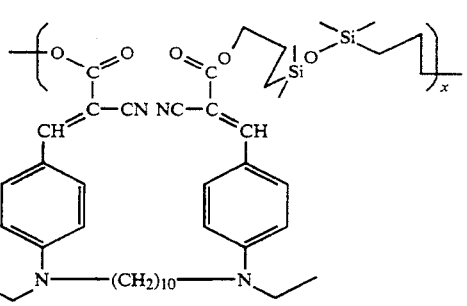

Example XXVIII

The synthesis of the fluorinated polymers of Example X was essentially followed except the fluorinated diols were replaced with siloxane diamine.

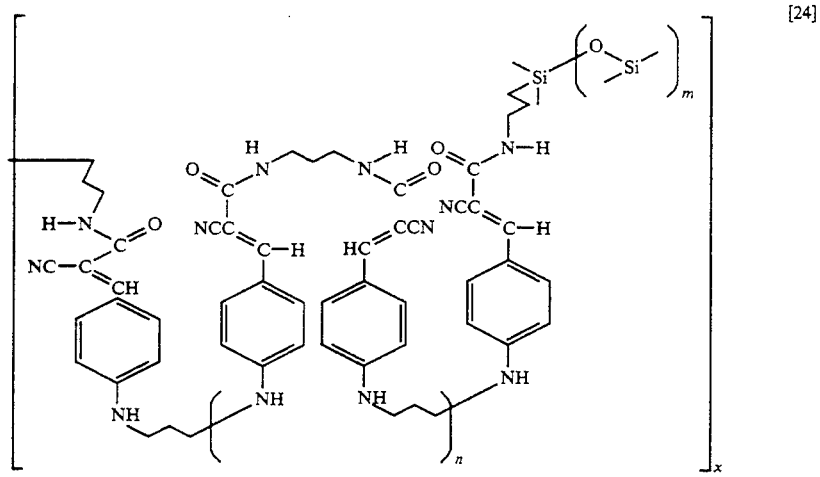

wherein n and m can range from about four to several hundred and x can range from about two to ten.

PREPARATION OF BIS STILBENES WITH THE FORMULA

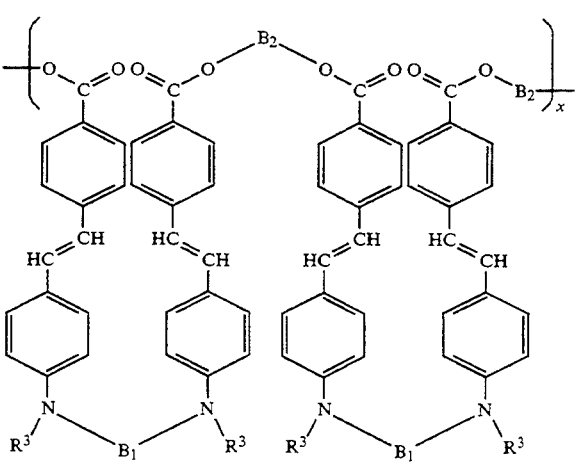

where Z, $R^1$, $R^2$ and $R^3$ are as above; follows the following basic reaction scheme:

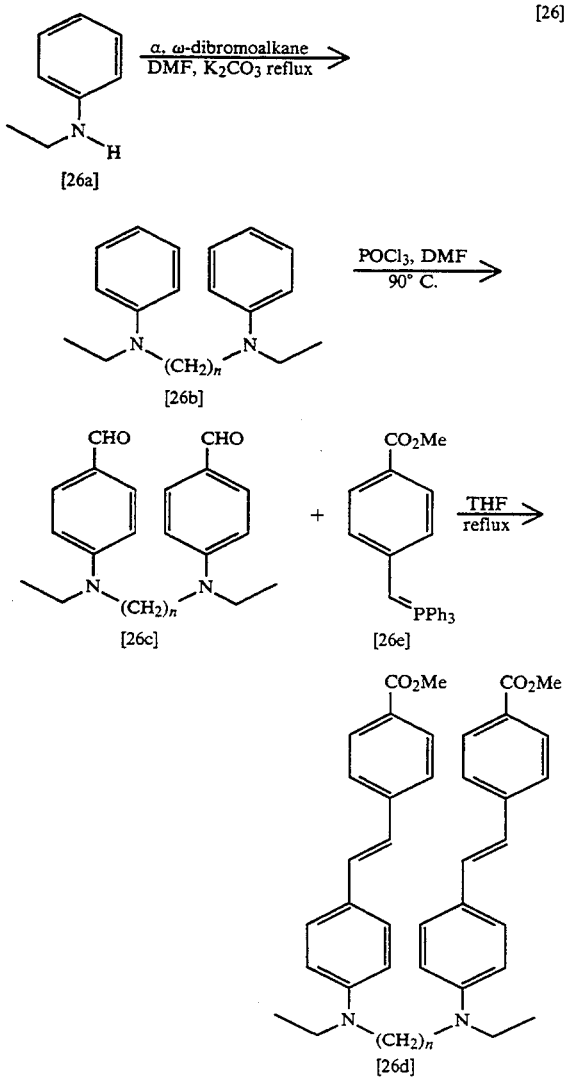

Example XXIX

Preparation of bis aniline [26b] with n=9

N-Ethyl aniline [26a] (6.2 mL, 50 mMol), 1,9-dibromononane (5.0 mL, 25 mMol), and potassium carbonate (7.6 g, 55 mMol) were mixed in DMF and refluxed with stirring for 18 hours. The light brown solution was cooled to ambient temperature, poured into water (300 mL), and extracted into ether (3×100 mL). The combined ether layers were washed with water (2×100 mL), brine (100), dried (MgSO$_4$), and solvent removed under reduced pressure to give 2 (7.7 g, 84% yield) as a brown oil The crude material is suitable for use directly in the next step.

$^1$H NMR (acetone d-6): δ7.15 m, 4H; 6.6 m, 6H; 3.30 m, 8H; 1.36 m, 14H; 1.11 t, J=7.0 Hz $^{13}$C NMR (CDCl$_3$): δ 147.9; 129.1; 115.2; 111.7; 50.4; 44.8; 29.6; 29.4; 27.5; 27.1.

IR (neat, cm$^{-1}$): 3010, 2920, 1600, 1505, 1370, 1265

Example XXX

Preparation of dialdehyde [26c] with n=9

Phosphorous oxychloride (6.4 mL, 69 mMol) was added to dry DMF (50 mL) at ambient temperature. After 5 minutes bis aniline [26b](8.6 g, 23 mMol) was dissolved in DMF (25 mL) and added in one portion. The solution became dark green-brown. This dark mixture was heated to 90° C. for one hour, cooled to room temperature and poured in water (100 mL) and made basic (pH 8) with 1M NaOH. The solution was extracted with ethyl acetate (3×75 mL). Organic layers were combined followed by washing with water (100 mL), brine (100 mL), drying (MgSO$_4$), and removal of volatiles under reduced pressure to give crude 3 (7.6 g) as a dark brown oil which was purified by silica gel chromatography eluting with 40% ethyl acetate in hexane. Final yield of [26c] was 4.5 g (46%) as a viscous yellow oil.

$^1$H NMR (acetone d-6): δ9.68 s, 2H; 7.66 d, J=8.9 Hz, 4H; 6.76 d, J=8.9 Hz, 4H; 3.45 m, 8H; 1.36 m, 20H $^{13}$C NMR (CDCl$_3$): δ 189.1; 152.0; 131.7; 124.1; 110.2; 50.0; 44.7; 32.2; 28.6; 28.4; 26.4; 11.8

IR (neat, cm$^{-1}$): 2910, 2710, 1670, 1590, 1530, 1410, 1170

Example XXXI

Preparation of bis stilbene [26d] with n=9 p-Ethyl (chloro triphenyl phosphonium) benzoate (13.4 g, 30 mMol) was added to potassium hydride (30 mMol) in dimethoxy ethane at room temperature. Color instantly turned dark orange. This orange suspension was stirred under nitrogen for 15 minutes followed by addition of dialdehyde [26c] (4.38 g, 10 mMol). The orange suspension was heated to reflux for 20 hours, cooled, and carefully quenched with 0.5M NaH$_2$PO$_4$ (200 mL) and extracted with ethyl acetate (3×75 mL). Combining the organic extracts, washing with water (100 mL), brine (100 mL), drying (MgSO$_4$), and removing solvent under reduced pressure afforded a yellow oil. Purification was accomplished by silica gel chromatography eluting with 20% ethyl acetate in hexane to give [26d] as a mixture of isomers (2.1 g, 31%). The desired trans-trans [26d] isomer was isolate pure after recrystallization of this oil from ethyl acetate/hexane (0.50 g, 7%).

$^1$H NMR (acetone d-6): δ7.94 d, J=8.8 Hz, 4H; 7.59 d, J=8.8 Hz, 4H; 7.45 d, J=8.8 Hz, 4H; 7.13 d, J=11.2 Hz, 4H; 6.64 m, 4H; 3.86 s, 6H; 3.39 m, 8H; 1.30 m, 22H IR (KBr, cm$^{-1}$): 2910, 1715, 1595, 1525, 1280 mp=65°-70° C.

Example XXXII

Preparation of [26d] with n=3 p-Chlorotriphenylphosphonium methylbenzoate (3.12 g, 7 mMol) is added to a solution of lithium diisopropyl amide (8 mMol) in THF (50 mL) stirring under nitrogen at 0° C. This dark orange suspension of [26e] is stirred for 20 minutes followed by addition of dialdehyde [26c] dissolved in THF (10 mL). The mixture is refluxed overnight, cooled to ambient temperature and purified on a silica gel column eluting with 20% ethyl acetate in pentane. Crude yield of [26d] is 0.79 grams representing a 44% yield. This product contains a mixture of isomers. An analytical sample of the pure trans-trans isomer was obtained by recrystallization from ethyl acetate-pentane.

$^1$H NMR (80 MHz acetone d-6): δ7.93 (d, J=8 Hz, 4H), 7.57 (d, J=8 Hz, 4H), 7.43 (d, J=8 Hz, 4H), 7.20 (s, 2H), 7.06 (s, 2H), 6.74 (d, J=8 Hz, 4H), 3.66 (s, 6H), 3.52 (m, 10H), 1.17 (t, J=7 Hz, 6H)

IR (neat) cm$^{-1}$: 1705 s, 1585 s, 1515 m, 1270 s, 1180 s, 1110 s mp=152° C. (dec)

Example XXXIII

Polymerization of [26d]

Equimolar portions of the isomers of Example XXXII, and 1,10-decanediol and a small drop of dibutyltindilaurate were placed in a 10 mL round bottom flask purged with dry nitrogen. After heating and stirring at 165° C. for 2.5 hours, the system was exposed to reduced pressure for an additional 4 hours at 160° C. The flask was then cooled to room temperature, and the polymer was dissolved in chloroform and precipitated into heptane.

PREPARATION OF A POLYMER HAVING THE FORMULA

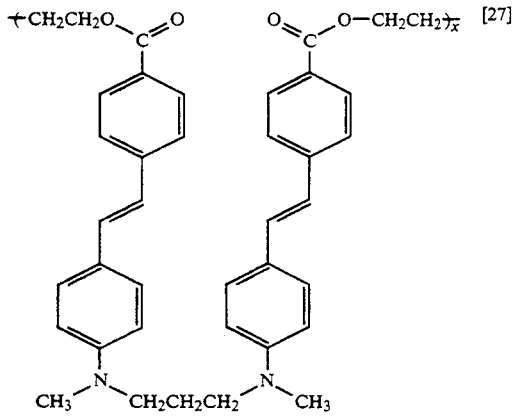
[27]

Example XXXIV

The polymerization of Example XXXIII was essentially followed except that the 1,10-decanediol was replaced with 1,4-butanediol.

Example XXXV

A 2 micron thick film of the polymer identified in Example XV was corona poled for 30 minutes at 170° C. (30° C. above Tg). When 1064 nm laser light was passed through the film, the film generated second harmonic light (532 nm) of twice the intensity of a quartz reference.

Stilbazolium chromophores

Polymers which contain formal charges are not desirable for electric field poling or applications which require a DC electric field to be applied over long periods of time. This is because the charges can slowly migrate in the field causing dielectric breakdown. Therefore, the stilbazolium chromophores must be processed by Langmuir-Blodgett deposition. Solutions of the chromophores are injected on the water surface and self-assemble on the water surface with the hydrophobic parts pushed into the air and the hydrophilic parts submerged in the water. A generic polystibazolium is shown below:

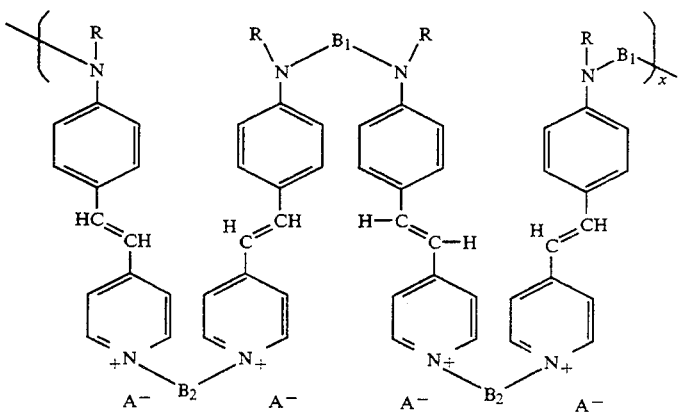

where R can be an alkyl of 1 to 22 carbon atoms.

Accordion polymers are also of interest for their piezo and pyro electric properties. Furthermore, the impact resistance (or energy to break) is enhanced due to energy consumed in unfolding of the accordion structure before chain cleavage.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. Water-insoluble, organo-soluble polymers characterized by having two or more sequences of the repeating unit having the formula:

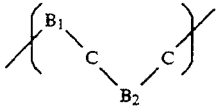

wherein $B_1$ is a bridging unit, C is a chromophoric unit, and $B_2$ is a second bridging unit; wherein the chromophoric unit has an electron accepting group and an electron donating group, connected by a rigid connecting group containing delocalized $\pi$-electrons, and wherein the chromophoric units are configured in a regular syndioregic orientation with respect to their ground-state dipole moments along the polymer backbone.

2. The polymers of claim 1, having a polar, noncentrosymmetric conformation as evidenced by at least one of the following attributes: a second-order nonlinear optical property, a piezoelectric property, or a pyroelectric property.

3. The polymeric compositions of claim 1, wherein each of the bridging units, $B_1$ and $B_2$, are independently selected from one of the following units:

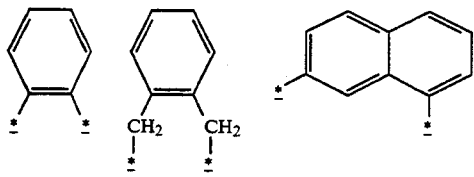

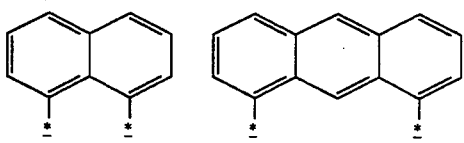

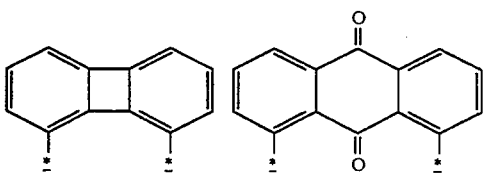

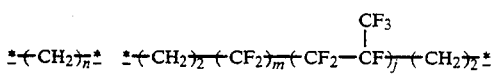

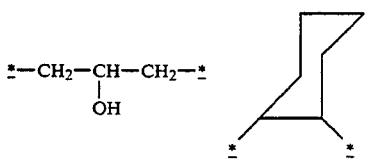

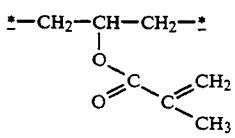

where * designates a bond of attachment between the bridging unit and a chromophoric unit, and wherein n is an integer from 1 to 12, m is an integer from 2 through 12 and j is an integer from zero through two.

4. The polymeric compositions of claim 1, wherein $B_1$ is attached to the electron donating group of two chromophoric units, and wherein $B_2$ is attached to the electron accepting group of two chromophoric units, wherein the ground-state dipole moments of the chromophoric units are at least 2 Debyes.

5. The polymeric compositions of claim 3 wherein,

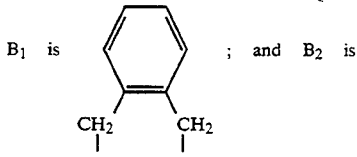

6. The polymeric compositions of claim 2, wherein said conformation is attained through self-assembly of the polymer on a surface.

7. The polymeric compositions of claim 2, wherein said conformation is attained through electric field poling self-assembly of the polymer on a surface.

8. Water-insoluble, organo-soluble polymers characterized by having two or more sequences of bridged chromophore units illustrated by the repeating unit having the formula:

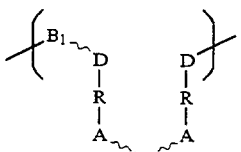

wherein $B_1$ is a bridging unit and $B_2$ is a second bridging unit;

wherein a chromophore unit is represented by the formula: D—R—A;

wherein A is an electron accepting group;

wherein D is an electron donating group; and, wherein R is a rigid connecting group containing delocalized $\pi$-electrons; and, wherein the chromophore units are configured in a regular syndioregic orientation with respect to their ground-state dipole moments along the polymer backbone.

9. Water-insoluble, organo-soluble polymers characterized by having two or more sequences of the repeating unit having the formula:

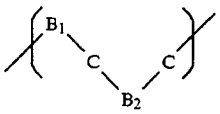

wherein $B_1$ is a bridging unit, C is a chromophoric unit, and $B_2$ is a second bridging unit;

wherein C has the formula:

D—R—A wherein A is an electron accepting group;

wherein D is an electron donating group; and, wherein R is a rigid connecting group containing delocalized $\pi$-electrons, and wherein the chromophoric units are configured in a regular syndioregic orientation with respect to their ground-state dipole moments along the polymer backbone.

* * * * *